United States Patent
Lin et al.

(10) Patent No.: US 6,926,818 B1
(45) Date of Patent: *Aug. 9, 2005

(54) METHOD TO ENHANCE THE ADHESION BETWEEN DRY FILM AND SEED METAL

(75) Inventors: Yih-Ann Lin, Taipei (TW); Tung-Heng Shie, Hsinchu (TW); Kai-Ming Ching, Taiping (TW); Sheng-Liang Pan, Hsinchu (TW); Kuo-Liang Lu, Hsin-Chu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 452 days.

This patent is subject to a terminal disclaimer.

(21) Appl. No.: 09/961,557

(22) Filed: Sep. 24, 2001

(51) Int. Cl.⁷ .................................. C25D 5/02
(52) U.S. Cl. ................. 205/123; 205/209; 205/224; 438/598; 438/612; 438/760
(58) Field of Search ................. 205/123, 209, 205/224; 438/598, 612, 760

(56) References Cited

U.S. PATENT DOCUMENTS

| 5,028,983 | A |   | 7/1991 | Bickford et al. ............ 357/69 |
| 5,118,386 | A | * | 6/1992 | Kataoka et al. ............ 216/13 |
| 5,149,776 | A | * | 9/1992 | Kushi et al. ............ 430/288.1 |
| 5,891,795 | A |   | 4/1999 | Arledge et al. ............ 438/613 |
| 6,117,299 | A |   | 9/2000 | Rinne et al. ............ 205/125 |
| 6,181,569 | B1 |   | 1/2001 | Chakravorty ............ 361/761 |
| 6,413,851 | B1 | * | 7/2002 | Chow et al. ............ 438/613 |
| 6,696,356 | B2 | * | 2/2004 | Tseng et al. ............ 438/612 |

* cited by examiner

Primary Examiner—Arun S. Phasge

(57) ABSTRACT

A method of forming a bump structure through the use of an electroplating solution, comprising the following steps. A substrate having an overlying conductive structure is provided. A patterned dry film resist is formed over the conductive structure. The patterned dry film resist having a trench exposing a portion of conductive structure. The patterned dry film resist adhering to the conductive structure at an interface. The structure is treated with a treatment that increases the adherence of the patterned dry film resist to the conductive structure at the interface. A conductive plug is over the exposed portion of the conductive structure within the trench through the use of the electroplating solution. The increased adhesion of the patterned dry film resist to the conductive structure at the interface preventing the electroplating solution from penetrating the interface of the patterned dry film resist and the conductive structure during the formation of the conductive plug. The patterned dry film resist is removed from the conductive structure. The conductive plug is reflowed to form the bump structure.

50 Claims, 4 Drawing Sheets

METHOD TO ENHANCE THE ADHESION BETWEEN DRY FILM AND SEED METAL

FIELD OF THE INVENTION

The present invention relates generally to semiconductor fabrication and more specifically to bump processes.

BACKGROUND OF THE INVENTION

The following are the steps in the current bump process:
(1) Barrier/seed layer sputtering;
(2) Dry film resist (DFR) patterning: DFR lamination, exposure, then PET peel off and development;
(3) Pre-plating treatment: chemical dry etch (CDE) then a deionized water (DI) rinse;
(4) Plating;
(5) DRF removal;
(6) Under bump metal (UBM) etching; and
(7) Flux coating and reflow.

U.S. Pat. No. 6,181,569 B1 to Chakravorty describes a semiconductor chip package fabricated by bump processes using dry films. The wafer is sawed to separate the individual chips to yield semiconductor packages which have the same lateral dimensions as the chips.

U.S. Pat. No. 6,117,299 to Rinne et al describes a method of electroplating solder bumps of uniform height on integrated circuit substrates.

U.S. Pat. No. 5,028,983 to Bickford et al. describes electronic device packaging structures useful for electrically interconnecting an electronic device to a substrate.

U.S. Pat. No. 5,891,795 to Arledge et al. describes a method of creating high density interlayer interconnects on circuit carrying substrates employing a bump process using a dry film and curing process.

SUMMARY OF THE INVENTION

Accordingly, it is an object of one or more embodiments of the present invention to provide improved methods of enhancing the adhesion between dry film resist and seed metal.

Other objects will appear hereinafter.

It has now been discovered that the above and other objects of the present invention may be accomplished in the following manner. Specifically, a substrate having an overlying conductive structure is provided. A patterned dry film resist is formed over the conductive structure. The patterned dry film resist having a trench exposing a portion of conductive structure. The patterned dry film resist adhering to the conductive structure at an interface. The structure is treated with a treatment that increases the adherence of the patterned dry film resist to the conductive structure at the interface. A conductive plug is over the exposed portion of the conductive structure within the trench through the use of the electroplating solution. The increased adhesion of the patterned dry film resist to the conductive structure at the interface preventing the electroplating solution from penetrating the interface of the patterned dry film resist and the conductive structure during the formation of the conductive plug. The patterned dry film resist is removed from the conductive structure. The conductive plug is re-flowed to form the bump structure.

BRIEF DESCRIPTION OF THE DRAWINGS

The present invention will be more clearly understood from the following description taken in conjunction with the accompanying drawings in which like reference numerals designate similar or corresponding elements, regions and portions and in which FIGS. 1 and 2 schematically illustrate a problem with the current practice discovered by the inventors.

DETAILED DESCRIPTION OF THE PREFERRED EMBODIMENT

Unless otherwise specified, all structures, layers, steps, methods, etc. may be formed or accomplished by conventional steps or methods known in the prior art.

Problems Discovered by the Inventors

Figure 1:
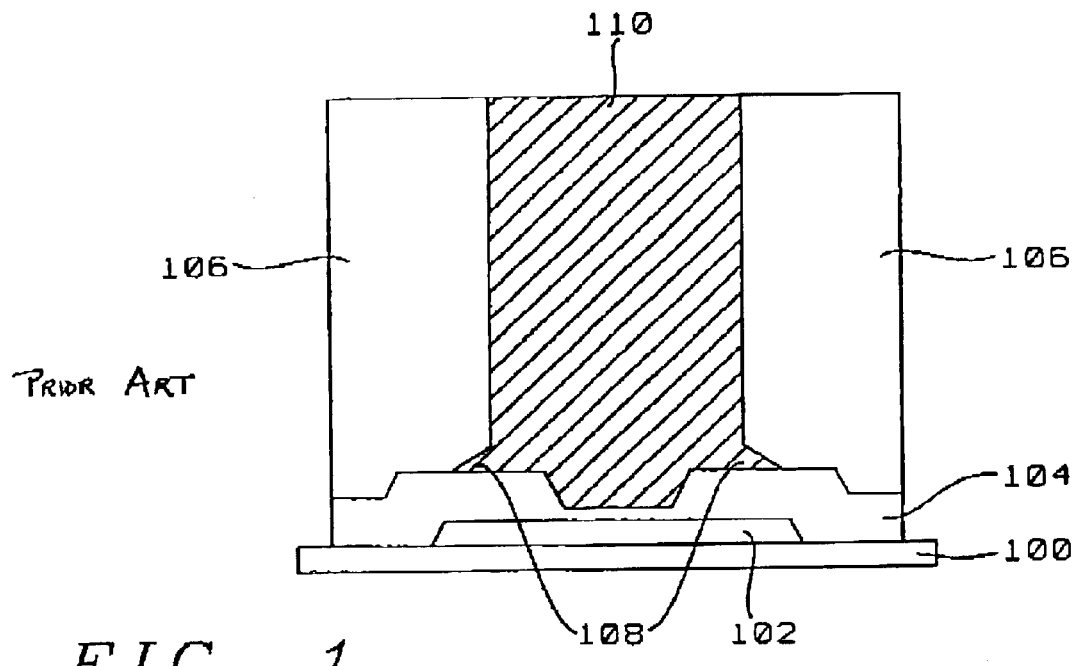
Figure 2:
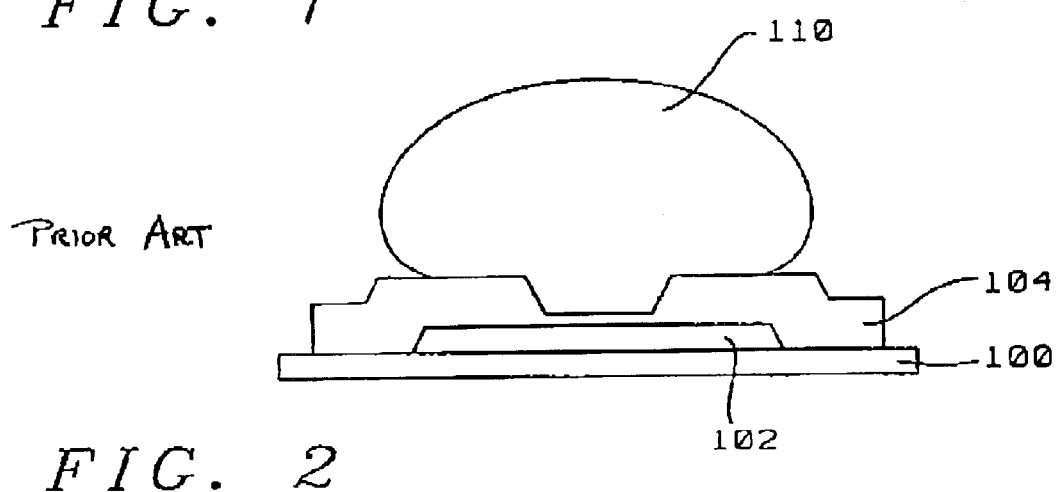

The inventors have discovered the following problems and disadvantages with the current practice as illustrated in FIGS. 1 and 2.

As shown in FIG. 1, in the current bump process, the adhesion between the dry film 106 and the seed metal 104 (such as copper (Cu)) is very important. Seed metal layer 104 may have an underlying barrier metal layer (not shown). If this adhesion is poor as shown at 108 for example, the electroplating solution will penetrate into the interface 108 between the dry film 106 and the seed metal 104 during plating. Barrier metal 102 having been formed over substrate 100 with seed metal 104 formed over bonding pad 102.

As shown in FIG. 2, undesired plating metal 110 will form at this penetration area 108, making the bumps 110' irregular after reflow, especially when this material is a solder wetting material, and will induce: (1) bridges between bumps; and (2) large bump width and low bump height after reflow as illustrated in FIG. 2.

Furthermore, $H_2SO_4$ (sulfuric acid) is usually used as the pretreatment solution to clean the surface of the seed metal before the metal plating. This process will further destroy the adhesion between the dry film 106 and the seed metal 104 and will induce the plating solution to penetrate into the dry film/seed metal interface as at 108 and result in bump failure.

Brief Summary of the Invention

"The bump metal process structure is subjected to an additional/partial substitute treatment at the "pre-plating treatment" step (step (3) above) of the current bump process.

At The Pre-Plating Treatment Step:

1. First Embodiment (Most Preferred): CDE; thermal oven treatment at from about 100 to 150° C. for more than about 10 minutes; then DI rinse;
2. Second Embodiment: CDE; thermal hot plate treatment at from about 100 to 150° C. for more than about 1 minute; then DI rinse;
3. Third Embodiment: CDE; UV treatment for more than about 10 minutes; then DI rinse; and
4. Fourth Embodiment: in-situ plasma treatment with an increased chuck temperature greater than about 55° C.

It is noted that standard bump fabrication processes and steps may be used in the present invention except as noted at pre-plating step (3)."

Steps Common to All Four Embodiments

Initial Structure

Figure 3:
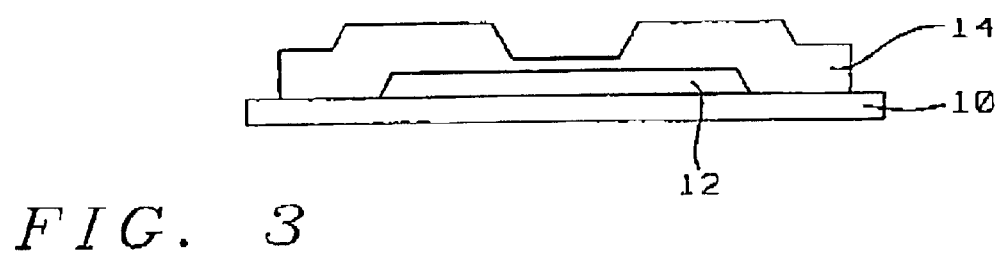
FIGS. 3 to 9 schematically illustrate the preferred embodiments of the present invention.

As shown in FIG. 3, starting substrate 10 includes at least one bonding pad 12. Substrate 10 is preferably a semiconductor structure and is also understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

(1) Barrier/Seed layer Sputtering

As shown in FIG. 3, patterned seed metal layer (under bump metal (UBM)) 14 is formed over bonding pad 12. An optional barrier metal layer (not shown) may be first formed over bonding pad 12 before formation of seed metal layer 14 over the barrier metal layer. Seed metal layer 14 and the optional barrier metal layer are preferably formed by sputtering.

(2) Dry Film Resist (DFR) Patterning

Figure 4:
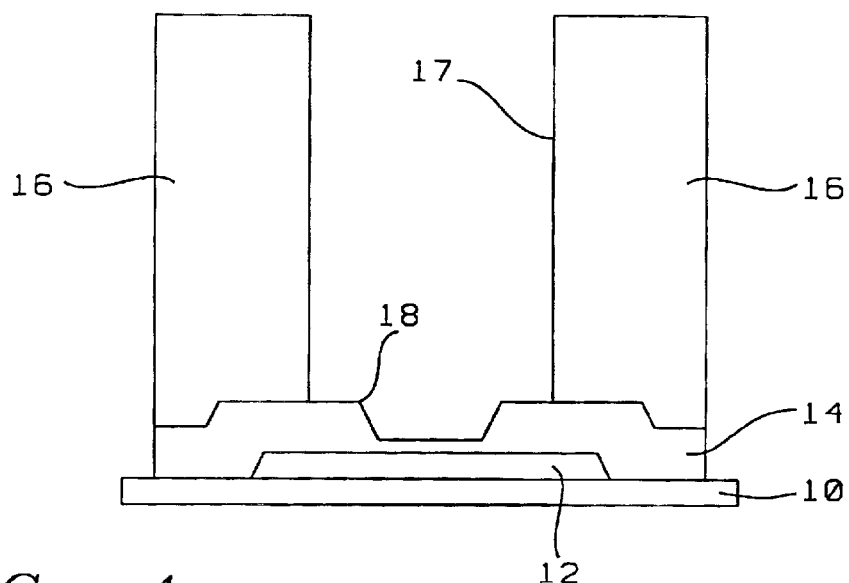

As shown in FIG. 4, dry film resist (DFR) is laminated over the structure, exposed and the PET is peeled-off and the DFR is developed to form the patterned DFR 16 forming trench 17 and exposing a portion of the patterned seed metal layer 14 at 18. DFR 16 is preferably comprised of 25% acrylic ester and 75% acrylic polymer 75%.

Figure 5:
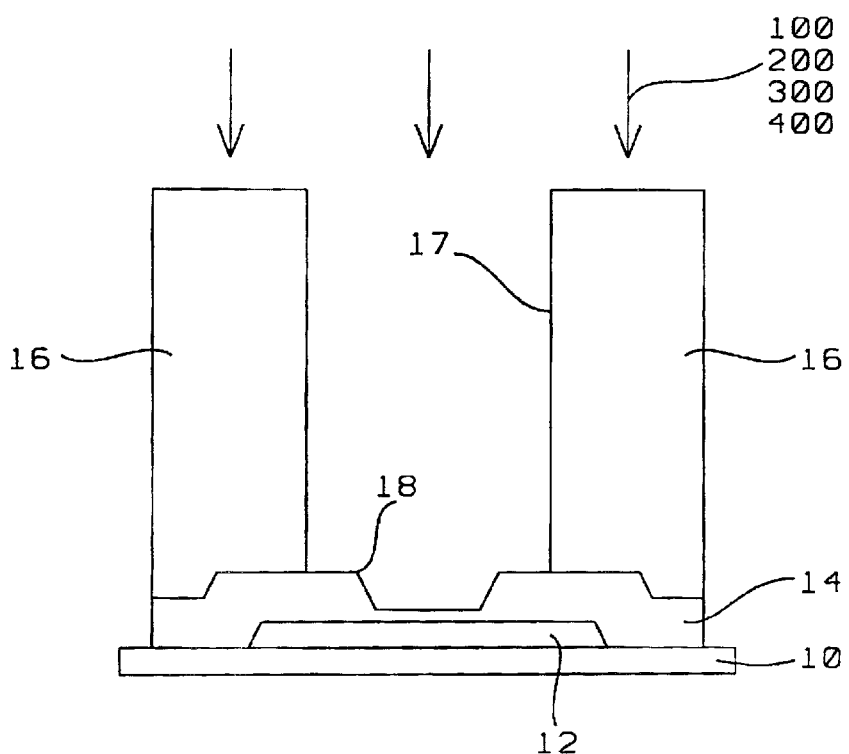

Treatment Common To The First, Second and Third Embodiments (3) Low Temperature CDE Treatment As shown in FIG. 5 and for the first, second and third embodiments, the structure is subjected to a cleaning process, preferably a chemical dry etch (CDE) (included in 100, 200 and 300), to remove DFR residue and scum after the DFR developing. Since the melting point ($T_g$) of DFR 16 is about 140° C., the CDE process is a low temperature process conducted at about 30° C. It is noted that the CDE treatment is not used in the fourth embodiment of the present invention.

First Embodiment (3) First Embodiment Oven Thermal Treatment 100—More Preferred Embodiment In the key step of the more preferred first embodiment and as shown in FIG. 5, after the low temperature CDE process, the structure is then subjected to a further oven thermal treatment 100 before plating. The inventors have discovered that any oven thermal treatment 100 conducted below 100° C. is useless to avoid plating metal penetration.

Oven thermal treatment 100 is conducted within an oven temperature of preferably from about 100 to 150° C. and more preferably from about 110 to 130° C. for preferably more than about 10 minutes. The inventors have discovered that oven thermal treatment 100 used before plating removes any adsorbed water, improves the cross-linking of the DFR, enhances the adhesion between dry film 16 and seed metal layer 14 and avoids the undesired plating metal penetration (see FIGS. 1 and 2).

Second Embodiment (3) Second Embodiment Hot Plate Thermal Treatment 200

In the key step of the second embodiment and as shown in FIG. 5, after the low temperature CDE process, the structure is then subjected to a further hot plate thermal treatment before plating. The inventors have discovered that any hot plate thermal treatment 200 conducted below 100° C. is useless to avoid plating metal penetration.

Hot plate thermal treatment 200 is conducted using a hot plate as a heat source at a temperature of preferably from about 100 to 150° C. and more preferably from about 110 to 130° C. for preferably more than about 1 minute. The inventors have discovered that hot plate thermal treatment 200 used before plating removes any adsorbed water, improves the cross-linking of the DFR, enhances the adhesion between dry film 16 and seed metal layer 14 and avoids the undesired plating metal penetration (see FIGS. 1 and 2).

Third Embodiment (3) Third Embodiment UV Treatment 300

In the key step of the third embodiment and as shown in FIG. 5, after the low temperature CDE process, the structure is then subjected to a further ultraviolet (UV) treatment 300 before plating.

UV treatment 300 is conducted for preferably more than about 10 minutes. The inventors have discovered that UV treatment 300 used before plating removes any adsorbed water, improves the cross-linking of the DFR, enhances the adhesion between dry film 16 and seed metal layer 14 and avoids the undesired plating metal penetration (see FIGS. 1 and 2).

Fourth Embodiment (3) Fourth Embodiment In-Situ Plasma Treatment 400 Without CDE In the key step of the fourth embodiment and as shown in FIG. 5, instead of the low temperature CDE process, the structure is then subjected to an in-situ plasma treatment 400, with an increased chuck temperature of preferably from about 55 to 85° C., more preferably from about 65 to 75° C. and most preferably about 70° C., for from about 1 to 5 minutes before plating. In-situ plasma treatment 400 provides the energy (heat and UV) to improve the bonding of DFR 16 to the seed metal 14 and avoid bump failure without the need for CDE.

The plasma used is preferably an $O_2$ plasma, a $CF_4$ plasma or an $N_2$ plasma, more preferably the plasma is an $O_2$ plasma. In-situ plasma treatment 400 is conducted at a wavelength of preferably less than about 500 nm for preferably from about 1 to 5 minutes. The inventors have discovered that in-situ plasma treatment 400 used before plating removes DFR residue and scum after the DFR developing, provides plasma curing functions, removes any adsorbed water, improves the cross-linking of the DFR, enhances the adhesion between dry film 16 and seed metal layer 14 and avoids the undesired plating metal penetration (see FIGS. 1 and 2). In the in-situ plasma treatment 400, the microwave energy heats the DFR and any adsorbed water uniformly, and the heat and UV can cross-link the DFR 16 and enhance the adhesion between patterned DFR 16 and patterned seed metal layer 14. During the plasma processing, the energy, which wavelength is less than about 500 nm, will be released. This kind of energy will also improve the adhesion between the dry film and seed metal.

Steps Common to All Four Embodiments (3) Deionized Water Rinse

As shown in FIG. 5 and for the first, second, third and fourth embodiments, the structure is then subjected to a deionized water (DI) rinse process (included in 100, 200, 300 and 400). This completes the pre-plating treatment.

(4) Plating

Figure 6:
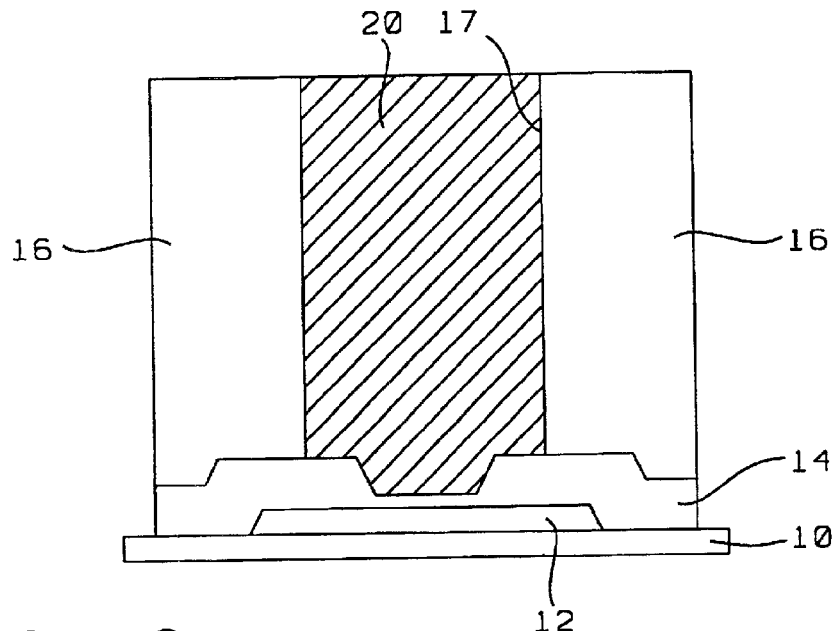

As shown in FIG. 6, solder/metal is then plated over the exposed portion 18 of seed metal layer 14, filling trench 17, through the use of an electroplating solution, and planarized to form solder/metal plug 20.

(5) Removal of Patterned DFR 16

Figure 7:
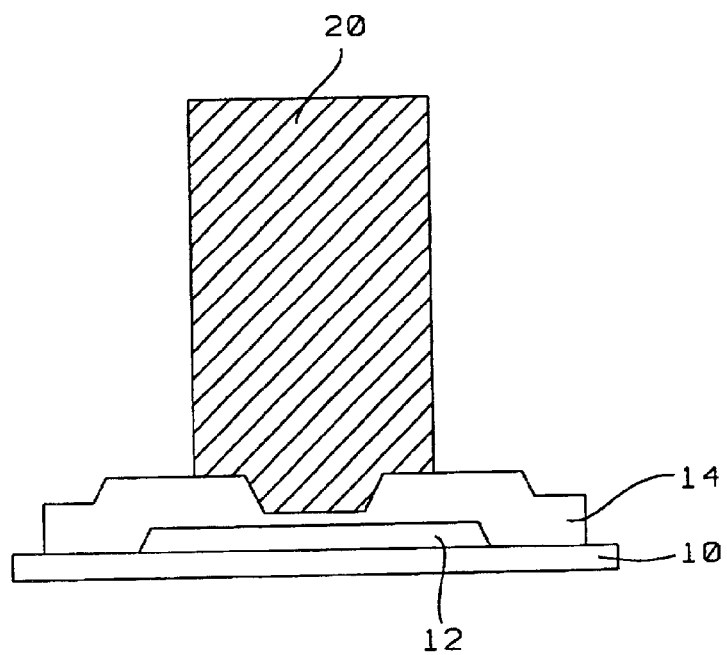

As shown in FIG. 7, patterned DFR 16 is removed from the structure, exposing solder/metal plug 20.

(6) Under Bump Metal (UBM) 14 Etching

Figure 8:
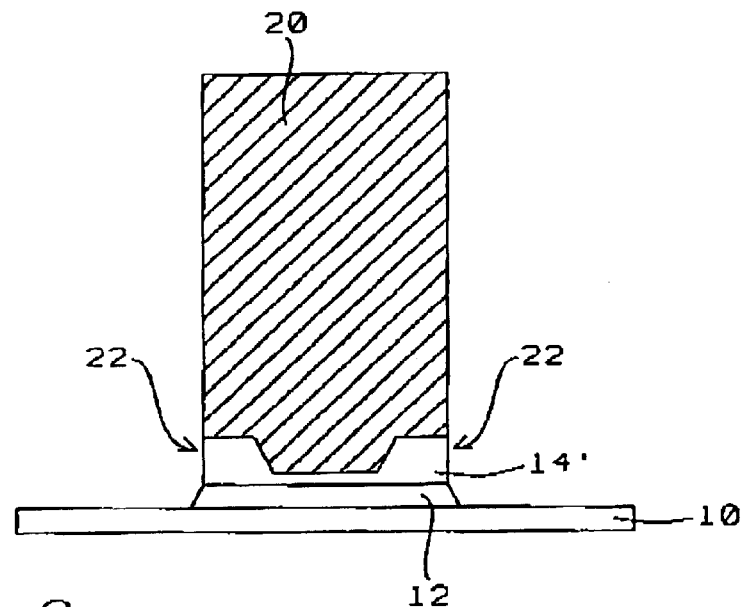

As shown in FIG. 8, UBM/patterned seed metal layer 14 is completely etched at 22.

(7) Flux Coating and Reflow

Figure 9:
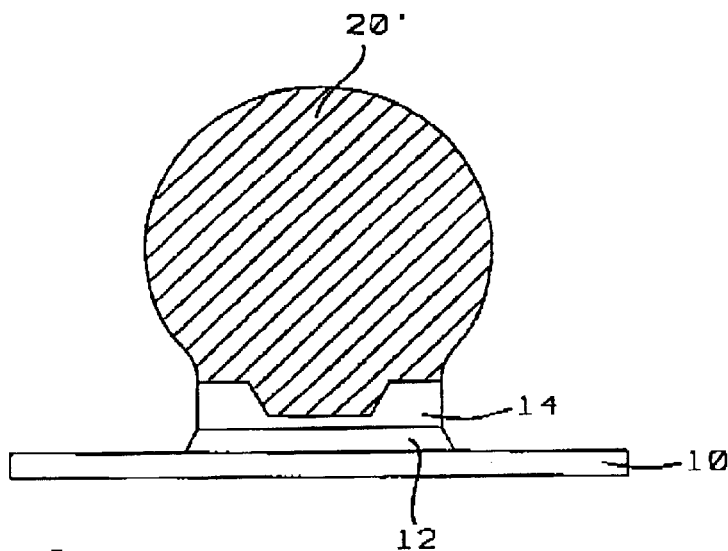

As shown in FIG. 9, a flux coating step is performed and exposed solder/metal plug 20 is subjected to a reflow to form bump 20' having a sufficiently narrow width and height without bridges between bumps 20'.

Advantages of the Present Invention

The advantages of one or more embodiments of the present invention include:
1. failure of bumps fabricated according to the present invention is minimized or eliminated; and
2. adhesion between the DFR and seed metal layer is improved.

While particular embodiments of the present invention have been illustrated and described, it is not intended to limit the invention, except as defined by the following claims.

We claim:

1. A method comprising the steps of:
   providing a conductive structure;
   forming a resist layer over at least a portion of the conductive structure; the resist layer having an opening exposing a portion of the conductive structure; the resist layer contacting the conductive structure at an interface;
   treating the structure to increase adhesion of the resist layer to the conductive structure at the interface;
   forming a conductive plug over the exposed portion of the conductive structure within the opening in the resist layer; the increased adhesion of the resist layer to the conductive structure at the interface preventing the conductive plug from penetrating into the interface between the resist layer and the conductive structure during plug formation;
   removing the resist layer from the conductive structure; and
   reflowing the conductive plug to form a bump structure.

2. The method of claim 1, including the step of performing a deionized water rinse of the structure after the structure treatment.

3. The method of claim 1, wherein the conductive structure is an under bump metal.

4. The method of claim 1, wherein the conductive structure is an under bump metal over a bonding pad.

5. The method of claim 1, wherein the resist layer is formed of acrylic ester and acrylic polymer.

6. The method of claim 1, wherein the resist layer is formed of about 25% acrylic ester and about 75% acrylic polymer.

7. The method of claim 1, wherein a dry etch is performed immediately before the treatment of the structure to remove resist residue.

8. The method of claim 1, wherein the conductive plug is formed by electroplating.

9. The method of claim 1, further comprising the step of flux coating at least a portion of the conductive plug prior to reflowing the plug.

10. The method of claim 1, wherein treating the structure comprises a thermal oven treatment at from about 100 to 150° C. for more than about 10 minutes.

11. The method of claim 1, wherein treating the structure comprises a thermal oven treatment at from about 110 to 130° C. for more than about 10 minutes.

12. The method of claim 1, wherein treating the structure comprises a thermal hot plate treatment at from about 100 to 150° C. for more than about 1 minute.

13. The method of claim 1, wherein treating the structure comprises a thermal hot plate treatment at from about 110 to 130° C. for more than about 1 minute.

14. The method of claim 1, wherein treating the structure comprises a UV treatment for more than about 10 minutes.

15. The method of claim 1, wherein treating the structure comprises an in-situ plasma treatment having a chuck temperature of from about 55 to 85° C. for from about 1 to 5 minutes with a plasma selected from the group consisting of an $O_2$ plasma a $CF_4$ plasma and an $N_2$ plasma at an wavelength of less than about 500 nm.

16. The method of claim 1, wherein treating the structure comprises an in-situ plasma treatment having a chuck temperature of from about 65 to 75° C. for from about 1 to 5 minutes with a plasma selected from the group consisting of an $O_2$ plasma a $CF_4$ plasma and an $N_2$ plasma at an wavelength of less than about 500 nm.

17. The method of claim 1, wherein treating the structure comprises an in-situ plasma treatment having a chuck temperature of about 70° C. for from about 1 to 5 minutes with a plasma selected from the group consisting of an $O_2$ plasma a $CF_4$ plasma and an $N_2$ plasma at an wavelength of less than about 500 nm.

18. A method comprising the steps of:
    providing a conductive structure;
    forming a resist layer over the conductive structure; the resist layer having an opening exposing a portion of the conductive structure; the resist layer contacting the conductive structure at an interface;
    performing an etch to remove resist residue;
    treating the structure with a thermal oven treatment at from about 100 to 150° C. for more than about 10 minutes to increase adhesion of the resist layer to the conductive structure at the interface;
    forming a conductive plug over the exposed portion of the conductive structure within the opening; the increased adhesion of the resist layer to the conductive structure at the interface preventing the conductive plug from penetrating into the interface of the resist and the conductive structure during plug formation;
    removing the resist layer from the conductive structure; and
    reflowing the conductive plug to form a bump structure.

19. The method of claim 18, including the step of performing a deionized water rinse of the structure after the thermal oven treatment.

20. The method of claim 18, wherein the conductive structure is an under bump metal.

21. The method of claim 18, wherein the conductive structure is an under bump metal over a bonding pad.

22. The method of claim 18, wherein the resist layer is formed of acrylic ester and acrylic polymer.

23. The method of claim 18, wherein the resist layer is formed of about 25% acrylic ester and about 75% acrylic polymer.

24. The method of claim 18, wherein a flux coating step is performed before the conductive plug reflowing step.

25. The method of claim 18, wherein the thermal oven treatment is conducted at a temperature of from about 100 to 130° C. for more than about 10 minutes.

26. A method comprising the steps of:
    providing a conductive structure;
    forming a resist layer over the conductive structure; the resist layer having an opening exposing a portion of conductive structure; the resist layer adhering to the conductive structure at an interface;
    performing an etch to remove resist residue;
    treating the structure with a thermal hot plate treatment at from about 100 to 150° C. for from more than about 1 minute to increase adhesion of the resist layer to the conductive structure at the interface;

forming a conductive plug over the exposed portion of the conductive structure within the opening; the increased adhesion of the resist layer to the conductive structure at the interface preventing the plug from penetrating the interface of the resist layer and the conductive structure during plug formation;

removing the resist layer from the conductive structure; and reflowing the conductive plug to form a bump structure.

27. The method of claim 26, including the step of performing a deionized water rinse of the structure after the thermal hot plate treatment.

28. The method of claim 26, wherein the conductive structure is an under bump metal.

29. The method of claim 26, wherein the conductive structure is an under bump metal over a bonding pad.

30. The method of claim 26, wherein the resist layer is formed of acrylic ester and acrylic polymer.

31. The method of claim 26, wherein the resist layer is formed of about 25% acrylic ester and about 75% acrylic polymer.

32. The method of claim 26, wherein a flux coating step is performed before the conductive plug reflowing step.

33. The method of claim 26, wherein the thermal hot plate treatment is conducted at a temperature of from about 110 to 130° C. for more than about 1 minute.

34. A method compromising the steps of:

providing a conductive structure;

forming a resist layer over the conductive structure; the resist layer having an opening exposing a portion of conductive structure; the resist layer adhering to the conductive structure at an interface;

performing an etch to remove resist residue;

treating the structure with a UV treatment to increase adhesion of the resist layer to the conductive structure at the interface;

forming a conductive plug over the exposed portion of the conductive structure within the opening in the resist layer; the increased adhesion of the resist layer to the conductive structure at the interface preventing the conductive plug from penetrating into the interface between the resist layer and the conductive structure during plug formation;

removing the resist layer from the conductive structure; and reflowing the conductive plug to form a bump structure.

35. The method of claim 34, including the step of performing a deionized water rinse of the structure after the UV treatment.

36. The method of claim 34, wherein the conductive structure is an under bump metal.

37. The method of claim 34, wherein the conductive structure is an under bump metal over a bonding pad.

38. The method of claim 34, wherein the patterned dry film resist is formed of acrylic ester and acrylic polymer.

39. The method of claim 34, wherein the resist layer is formed of about 25% acrylic ester and about 75% acrylic polymer.

40. The method of claim 34, wherein a flux coating step is performed before the conductive plug reflowing step.

41. The method of claim 34, wherein the UV treatment is conducted for more than about 10 minutes.

42. A method comprising the steps of:

providing a conductive structure;

forming a resist layer over the conductive structure; the resist layer having an opening exposing a portion of the conductive structure; the resist layer adhering to the conductive structure at an interface;

treating the structure with an in-situ plasma treatment for from about 1 to 5 minutes at a wavelength of less than about 500 nm to increase the adherence of the resist layer to the conductive structure at the interface;

forming a conductive plug over the exposed portion of the conductive structure within the opening; the increased adhesion of the resist layer to the conductive structure at the interface preventing the plug from penetrating the interface of the resist layer and the conductive structure during plug formation;

removing the resist layer from the conductive structure; and reflowing the conductive plug to form a bump structure.

43. The method of claim 42, including the step of performing a deionized water rinse of the structure after the in-situ plasma treatment.

44. The method of claim 42, wherein the conductive structure is an under bump metal.

45. The method of claim 42, wherein the conductive structure is an under bump metal over a bonding pad.

46. The method of claim 42, wherein the resist layer is formed of acrylic ester and acrylic polymer.

47. The method of claim 42, wherein the resist layer is formed of about 25% acrylic ester and about 75% acrylic polymer.

48. The method of claim 42, wherein a flux coating step is performed before the conductive plug reflowing step.

49. The method of claim 42, wherein the in-situ plasma treatment removes resist residue.

50. The method of claim 42, wherein the in-situ plasma treatment includes a plasma selected from the group consisting of an $O_2$ plasma, a $CF_4$ plasma and an $N_2$ plasma.

* * * * *